United States Patent [19]
Marshall et al.

[11] Patent Number: 6,079,332
[45] Date of Patent: *Jun. 27, 2000

[54] SHOCK-RESISTANT ELECTRONIC CIRCUIT ASSEMBLY

[75] Inventors: Paul N. Marshall, Avon; Thomas C. Tseka, West Suffield; Brendan M. Walsh, Simsbury; James E. Fritz, Ellington, all of Conn.

[73] Assignee: The Ensign-Bickford Company, Simsbury, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/742,296

[22] Filed: Nov. 1, 1996

[51] Int. Cl.⁷ .............................. F42C 19/08; F42C 19/12
[52] U.S. Cl. .................................. 102/202.5; 102/202.14
[58] Field of Search .............................. 102/276, 202.12, 102/202.14, 206, 210, 207, 275.12, 217, 275.11, 304, 318, 322, 331, 204, 216; 174/52.2; 206/523, 594; 429/98

[56] References Cited

U.S. PATENT DOCUMENTS

| | | | |
|---|---|---|---|
| 3,566,003 | 2/1971 | Wislocky | 174/52.2 |
| 3,581,883 | 6/1971 | Whitney | 206/46 |
| 3,612,749 | 10/1971 | Gruber, Jr. et al. | 174/52.2 |
| 3,756,157 | 9/1973 | England et al. | 102/206 |
| 3,757,695 | 9/1973 | Fisher | 102/211 |
| 3,885,223 | 5/1975 | Green | 337/406 |
| 3,909,504 | 9/1975 | Browne | 264/272 |
| 3,956,672 | 5/1976 | Dumas | 317/99 |
| 3,981,240 | 9/1976 | Gladden . | |
| 3,987,732 | 10/1976 | Spraggs et al. . | |
| 4,037,538 | 7/1977 | Andrews et al. | 102/23 |
| 4,118,861 | 10/1978 | Palmisano | 29/631 |
| 4,132,171 | 1/1979 | Pawlak et al. | 102/304 |
| 4,164,619 | 8/1979 | Sprengling et al. | 174/52.2 |
| 4,220,088 | 9/1980 | Kimura et al. | 102/202.14 |

(List continued on next page.)

OTHER PUBLICATIONS

Definition for "boss"; American Heritage Dictionary, 1976.
Definition for "polyethylene"; Condensed Chemical Dictionary; Van Nostrand Reinhold Co., 1971.
Definition for "silicon"; Condensed Chemical Dictionary; Van Nostrand Reinhold Co., 1971.
Definitions for "encapsulate" and "encase"; Webster's New Riverside University Dictionary, 1994.
Definition for "detonator" from the Glossary of Commercial Explosives Industry Terms, Institute of Makers of Explosives, Feb. 1991.
Digidet™ Delay Detonators: A New Approach To Electronic Blasting: J. Childs et al; Seminar Jul. 8–13, 1995.

*Primary Examiner*—Charles T. Jordan
*Assistant Examiner*—Christopher K. Montgomery
*Attorney, Agent, or Firm*—Law Office of Victor E. Libert; Frederick A. Spaeth

[57] ABSTRACT

A shock-resistant electronic circuit assembly (10) is provided in which an electronic circuit is encased in an encapsulation (14) that engages a surrounding enclosure (18, 22) in shock-dispersing contact therewith. The encapsulation may have a plurality of edges (16, 16a, 16b), fins (24) or bosses (70) that bear against the enclosure. The encapsulation may include a shock-absorbing material (14f) disposed against the enclosure to protect the circuit against vibrations and a structural support material (14e) to protect the circuit against stress. The circuit assembly (10) may contain a capacitor (34) for storing an electrical signal and timing circuitry for releasing the stored energy after a predetermined delay. The circuit assembly (10) may be part of a transducer-circuit assembly (55) that includes a transducer module (58) for converting shock wave energy into electrical energy for the electronic circuit, and the released energy may be converted into a detonation initiation signal. Assembly (55) may be part of a detonator (100) that receives a non-electric initiation signal and detonates following the delay determined by the electronic circuit. The detonator housing (112) or an optional sleeve (22) provides an enclosure for the assembly (55).

11 Claims, 8 Drawing Sheets

U.S. PATENT DOCUMENTS

| | | |
|---|---|---|
| 4,316,412 | 2/1982 | Dinegar et al. ............... 102/202.7 |
| 4,369,708 | 1/1983 | Bryan et al. ............... 102/202.14 |
| 4,400,858 | 8/1983 | Goiffon et al. ............... 24/255 BS |
| 4,480,148 | 10/1984 | Archer . |
| 4,567,545 | 1/1986 | Mettler, Jr. . |
| 4,586,436 | 5/1986 | Denney et al. . |
| 4,600,969 | 7/1986 | Hendrickson . |
| 4,600,971 | 7/1986 | Rose et al. . |
| 4,607,573 | 8/1986 | Thureson et al. . |
| 4,656,442 | 4/1987 | Hayakawa . |
| 4,676,165 | 6/1987 | Gordon et al. ............... 102/202.5 |
| 4,685,303 | 8/1987 | Branc et al. ............... 62/3 |
| 4,708,060 | 11/1987 | Bickes, Jr. et al. . |
| 4,712,477 | 12/1987 | Aikou et al. ............... 102/206 |
| 4,763,188 | 8/1988 | Johnson . |
| 4,825,765 | 5/1989 | Ochi et al. . |
| 4,831,932 | 5/1989 | Bayerkohler et al. ............... 102/202.5 |
| 4,852,493 | 8/1989 | Boberg et al. ............... 102/202.5 |
| 4,869,170 | 9/1989 | Dahmberg et al. ............... 102/202.5 |
| 4,891,734 | 1/1990 | More et al. . |
| 4,933,744 | 6/1990 | Segawa et al. . |
| 4,976,200 | 12/1990 | Benson et al. . |
| 5,003,879 | 4/1991 | Jones ............... 102/204 |
| 5,015,801 | 5/1991 | Schaller et al. . |
| 5,059,746 | 10/1991 | Hayes et al. . |
| 5,105,742 | 4/1992 | Summer ............... 102/312 |
| 5,111,364 | 5/1992 | Yoshimoto et al. ............... 361/399 |
| 5,133,257 | 7/1992 | Jonsson . |
| 5,173,569 | 12/1992 | Pallanck et al. . |
| 5,285,559 | 2/1994 | Thompson et al. ............... 29/841 |
| 5,293,002 | 3/1994 | Grenet et al. ............... 174/52.2 |
| 5,295,045 | 3/1994 | Kitano et al. . |
| 5,319,522 | 6/1994 | Mehta . |
| 5,323,150 | 6/1994 | Tuttle . |
| 5,370,053 | 12/1994 | Williams et al. ............... 102/202.5 |
| 5,377,592 | 1/1995 | Rode et al. . |
| 5,433,147 | 7/1995 | Brede et al. . |
| 5,435,248 | 7/1995 | Rode et al. . |
| 5,488,908 | 2/1996 | Gilpin et al. . |
| 5,491,608 | 2/1996 | Koyanagi et al. ............... 361/685 |
| 5,522,318 | 6/1996 | Gladden et al. . |
| 5,535,092 | 7/1996 | Bang ............... 361/685 |
| 5,568,357 | 10/1996 | Kochis et al. ............... 361/681 |
| 5,585,591 | 12/1996 | Waldock ............... 102/202.12 |
| 5,589,657 | 12/1996 | Gessel et al. ............... 102/202.14 |
| 5,595,319 | 1/1997 | Householder et al. ............... 220/429 |
| 5,756,926 | 5/1998 | Bonbrake et al. ............... 102/215 |
| 5,763,816 | 6/1998 | Keeling ............... 102/322 |
| 5,770,941 | 6/1998 | Van Der Berg ............... 324/207.16 |
| 5,837,925 | 11/1998 | Nice ............... 102/310 |

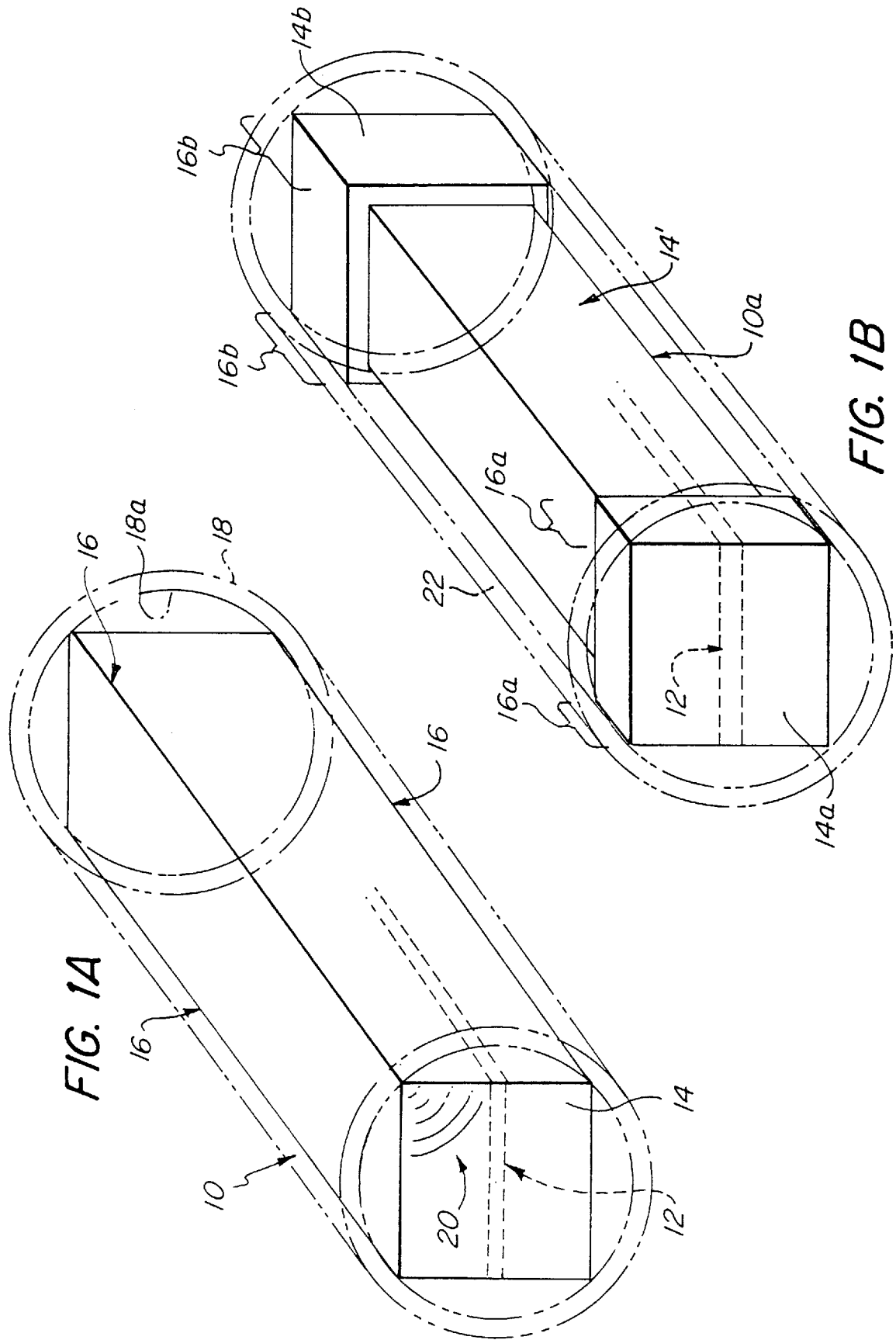

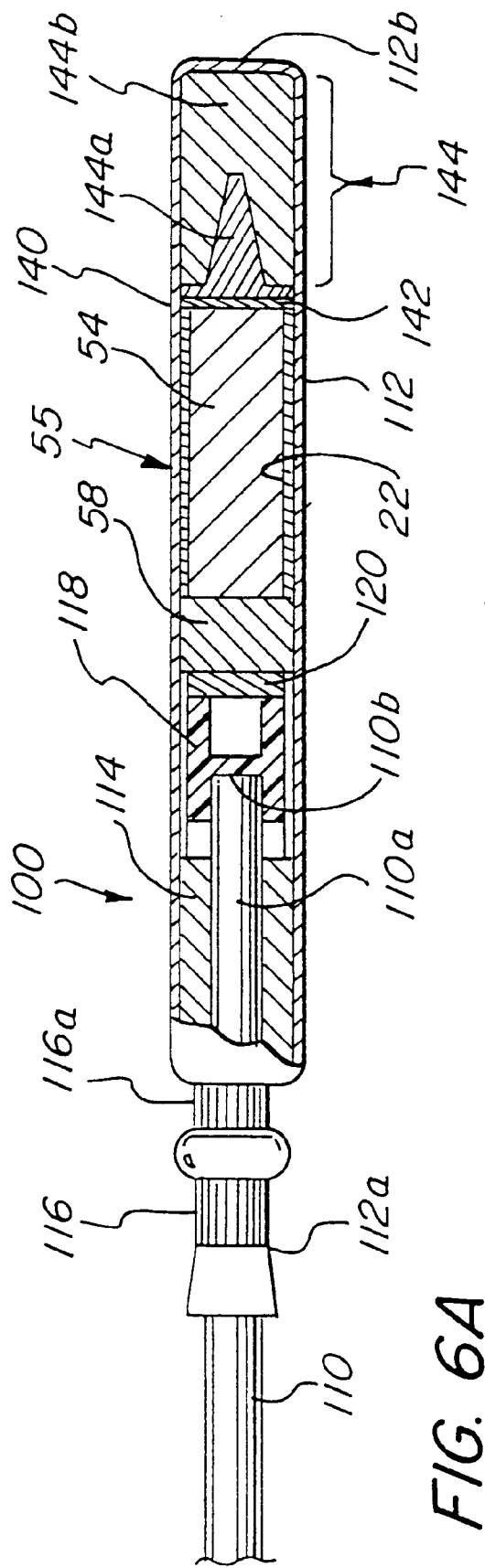
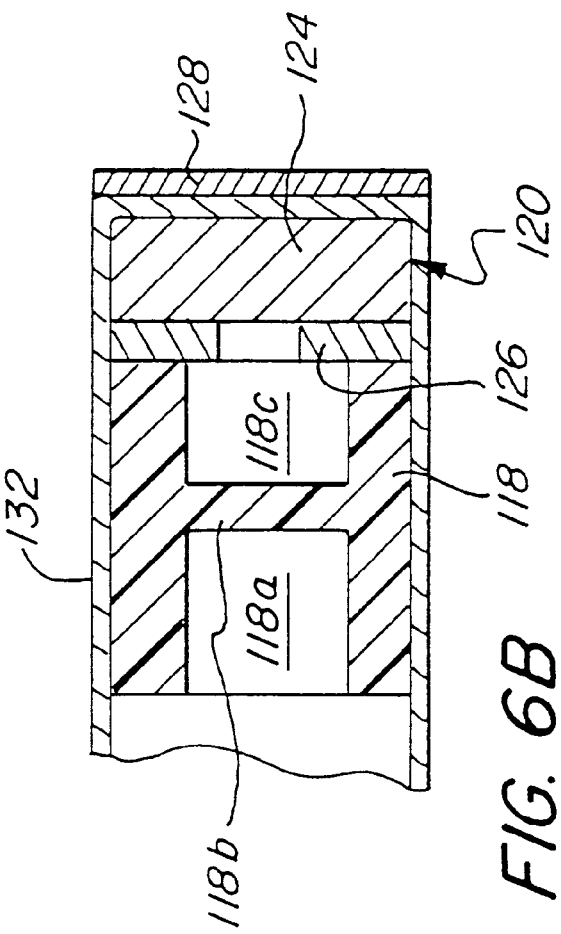
FIG. 6A
FIG. 6B

SHOCK-RESISTANT ELECTRONIC CIRCUIT ASSEMBLY

BACKGROUND OF THE INVENTION

1. Field of the Invention

This invention relates to encapsulated electronic circuits and, in particular, to shock-resistant electronic circuit assemblies that find use in blasting components.

2. Related Art

Electronic timing circuits for firing detonators after a predetermined, electronically-controlled delay period are known. The delay period is measured from the receipt of an initiation signal that may provide power for the timing circuit. Thus, U.S. Pat. No. 5,133,257 to Jonsson, issued Jul. 28, 1992, discloses an ignition system comprising a piezoelectric transducer that can be disposed next to a detonating cord branch line. When the detonating cord detonates, a shock wave is imposed on the piezoelectric transducer which then produces an electrical pulse. The electrical energy from the transducer is stored in a capacitor which provides power for a timer. After a predetermined delay, the timer allows the remaining stored energy in the capacitor to fire an ignition head in the detonator. The ignition head initiates explosive material, thus providing the explosive output for the detonator. Electronic delay circuits may also be used to initiate bridge elements such as a semiconductor bridge as described, e.g., in U.S. Pat. No. 4,708,060 to Bickes, Jr. et al, issued Nov. 24, 1987, or a tungsten bridge as described, e.g., in U.S. Pat. No. 4,976,200 to Benson et al, issued Dec. 11, 1990. Other electronic delay circuits are seen in U.S. Pat. No. 5,173,569 to Pallanck et al, issued Dec. 22, 1992; in U.S. Pat. No. 5,377,592 to Rode et al, issued Jan. 3, 1995; and in U.S. Pat. No. 5,435,248 to Rode et al, issued Jul. 25, 1995. These patents generally suggest that the electronic circuitry be molded within a suitable plastic package, casing or "potting compound". See, e.g., the Jonsson Patent at column 2, lines 42–50; the Pallanck et al Patent at column 3, lines 32–35; the Rode et al Patent (U.S. Pat. No. 5,377,592) at column 9, lines 30–33 and the Rode et al Patent (U.S. Pat. No. 5,435,248) at column 7, lines 9–13. The stated purpose for such enclosures is to protect the electronic components and minimize the chances of detonation or damage by mechanical impact. No particular configuration or material for such casings is disclosed in these patents.

SUMMARY OF THE INVENTION

The present invention relates to a shock-resistant electronic circuit assembly comprising an electronic circuit encased in an encapsulation that is dimensioned and configured to comprise cylindrically protuberant portions.

According to various aspects of the invention, the encapsulation may have a generally polygonal configuration, or it may be configured to define a plurality of protuberant bosses, or it may be configured to define protuberant fins.

According to another aspect of the invention, the circuit assembly may be disposed within a rigid enclosure having an interior surface, with the encapsulation engaging said interior surface in limited contact therewith.

According to still another aspect of the invention, the encapsulation may comprise a decoupling material and, optionally, a structural support material. The support material and the decoupling material may each have a density and the density of the decoupling material may be at least 20 percent less than the density of the support material.

In a particular embodiment of the invention, the electronic circuit may comprise a delay circuit comprising (i) storage means having an input terminal for receiving and storing electrical energy; (ii) a switching circuit connecting the storage means to an output terminal for releasing energy stored by the storage means to the output terminal in response to a signal from a timer circuit; (iii) a timer circuit operatively connected to the switching circuit for controlling the release by the switching circuit of energy stored by the storage means to an output terminal. The input terminal extends through the encapsulation to permit the delivery of electrical energy to the storage means from outside the encapsulation. The output terminal also extends through the encapsulation, for delivering electrical energy from the storage means via the switching circuit to outside the encapsulation.

There may be an output initiation means operatively connected to the storage means through the switching circuit for receiving via the switching circuit energy stored by the storage means and for generating an explosive output initiation signal in response thereto. There may be a sleeve having an interior enclosure surface dimensioned and configured to receive the delay circuit therein. The encapsulation engages the interior surface of the sleeve in shock-dispersing contact therewith, as described herein.

The invention also provides a transducer-initiation unit comprising the circuit assembly, sleeve and output initiation means described above in combination with a transducer module comprising a bushing that is dimensioned and configured to engage the sleeve. The transducer module comprises a piezoelectric transducer in the bushing and a pair of transducer leads connected to the input terminal of the circuit assembly.

The invention also provides a delay detonator comprising an enclosure that comprises at least a housing closed at one end and open at the other end for end-wise connection to an initiation signal means for providing an electric initiation signal to a shock-resistant delay circuit assembly as described above. The delay circuit assembly is in the housing, and there is an output means disposed in the housing in operative relation to the storage means, for receiving via the switching circuit energy stored by the storage means and for generating an explosive output in response thereto. In one embodiment, the delay circuit comprises an encapsulation dimensioned and configured for limited contact with an interior surface of the enclosure, e.g., the encapsulation may have a cylindrically protuberant configuration. In another embodiment the encapsulation may comprise a structural support material and a decoupling material and, optionally, may be configured for limited contact with an interior surface of the enclosure. In a particular embodiment, the enclosure may comprise a sleeve disposed within the housing and the encapsulation may engage the interior surface of the sleeve.

BRIEF DESCRIPTION OF THE DRAWINGS

FIG. 1A is a schematic axonometric view of encapsulated circuitry or "encapsulated module" in a surrounding enclosure shown in dotted outline in accordance with one embodiment of the present invention;

FIG. 1B is a view similar to FIG. 1A of an electronics module and enclosure in accordance with a different embodiment of the present invention;

FIG. 6A is a schematic, partly cross-sectional view showing a delay detonator comprising an encapsulated electronic circuit in accordance with one embodiment of the present invention; and FIG. 6B is a view, enlarged relative to FIG. 6A, of the isolation cup and booster charge components of the detonator of FIG. 6A.

DETAILED DESCRIPTION OF THE INVENTION AND PREFERRED EMBODIMENTS THEREOF

Figure 2A:
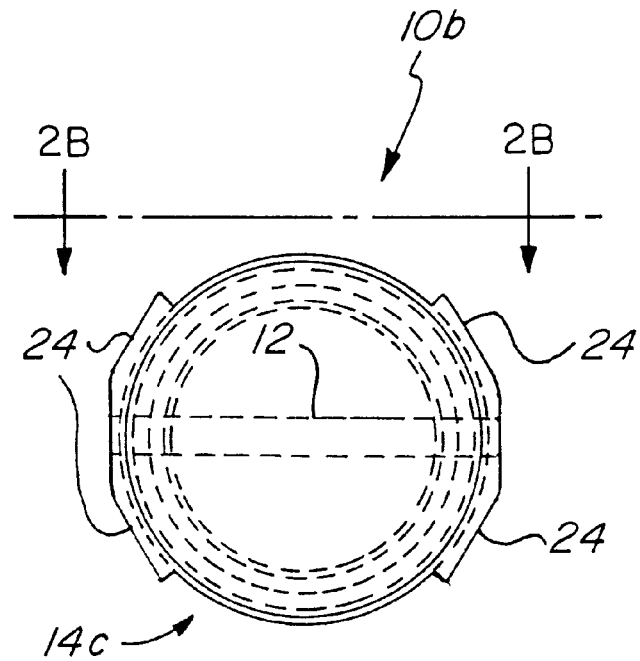
FIG. 2A is a schematic elevational view of an electronics module in accordance with yet another embodiment of the present invention.

The present invention relates to a protective encapsulation for an electronic circuit disposed in a rigid surrounding enclosure such as a metal shell. Preferably, at least part of the encapsulation is molded about the circuit prior to positioning the circuit in the enclosure, leaving external access only for leads for programming, testing and using the circuit, to protect the circuit from environmental damage. The encapsulation of the present invention protects the circuit after it is in the enclosure by attenuating shock waves received by the enclosure that might otherwise cause stress that causes damage to the circuit particularly, it is believed, at junctions between circuit structures and interfaces of materials of differing densities. The encapsulation also protects the circuit by preventing the circuit from colliding against the enclosure.

The encapsulation of the present invention may be physically configured to attenuate such shock waves, and/or it may comprise materials that attenuate such shock waves without regard to the physical configuration of the encapsulation. For example, the encapsulation may be physically configured so that, when it is disposed in the enclosure, there is limited contact between the encapsulation and the enclosure. The encapsulation then prevents the circuit from striking the enclosure as the result of vibrations or short-term accelerations, and it attenuates shock waves received by the enclosure because they can only reach the circuit through those portions of the encapsulation that engage the enclosure. The remainder of the encapsulation diffuses the shock wave and thus protects the circuitry. Alternatively, the encapsulation may comprise a shock-diminishing material that not only cushions the circuit against collision with the enclosure but also impedes the transmission of shock waves and vibrations from the enclosure regardless of the degree of contact between the encapsulation and the enclosure. The encapsulation may yet be sufficiently rigid to protect the circuit against damage from inadvertent bending such as might otherwise occur during the manufacture of a device comprising the circuit or as a result of a shock-induced acceleration of the circuit within an enclosure in a direction that is not parallel to the axis of the enclosure. In other words, the encapsulation provides structural support for the circuit. Optionally, the encapsulation may comprise distinct materials that provide structural support and vibration decoupling. The density and, preferably, the hardness of a decoupling material is typically lower than the densities and hardnesses of the structural support material and the enclosure engaged by the encapsulation. The density of the decoupling material is preferably at least 20 percent less than the density of the structural support material and is preferably in the range of 20 to 60 percent less, although in some cases decoupling materials of even lesser relative densities may be used. Even when the structural support material is separated from the enclosure by the decoupling material, it is preferred that the structural support material be configured to disperse shock waves from the enclosure. Accordingly, the structural support material may provide a circuit casing configured so that its periphery defines a non-uniform set-off from the interior surface of the enclosure. For example, a polygonal casing within an enclosure having a cylindrical interior surface will serve to dissipate shock waves received from the enclosure even if the casing is surrounded by a decoupling material and does not directly engage the interior surface of the enclosure.

Optionally, an encapsulation according to the present invention may have both of the above-described features, i.e., it may be physically configured for limited contact with an enclosure and it may also comprise a vibration decoupling material.

The invention finds utility in protecting any circuit disposed in a rigid enclosure that may be subjected to physical vibrations or shock waves, but is preferably used to protect the electronic circuit of an electronically-controlled detonator. Detonators made with encapsulated electronic circuit assemblies in accordance with the present invention are less likely to be damaged by the prior detonation of neighboring charges and will therefore detonate more consistently at the appropriate times than prior art detonators. Since the enclosures provided by most detonators comprise cylindrical housings and, optionally, a cylindrical sleeve in the housing, both of which provide a cylindrical interior surface, an encapsulation that is physically configured for limited contact with the enclosure may have any of a variety of non-cylindrical configurations referred to herein and in the claims as "cylindrically protuberant" configurations. An encapsulation with a cylindrically protuberant configuration has an exterior surface that only partially engages a cylindrical interior surface of an enclosure, leaving a portion of the encapsulation distanced from the interior surface of the enclosure. Some examples of cylindrically protuberant configurations are described below in relation to FIG. 1A through FIG. 4.

Typically, an electronic detonator timing circuit comprises various integrated and discrete circuit elements including a storage means such as a capacitor which receives and stores an electrical initiation signal. The delay circuit generally includes an electronic switching circuit that can, upon receipt of a firing signal from a timer circuit, discharge the capacitor to an output terminal where an initiation element such as a hotwire, bridgewire or semiconductor bridge may be connected to the circuit. The firing signal is provided by a timer circuit following a predetermined delay interval measured from the receipt of the electrical initiation signal. Conventionally, the timer circuit and switching circuit are manufactured as integrated circuits, and they are used in conjunction with certain other, discrete circuit elements. The electronic circuit is typically assembled by disposing the circuit elements on a small portion of printed circuit board that provides the necessary electrical connections between them, using so-called surface mount technology. Alternatively, the circuit elements may be mounted on a lattice-like lead frame that supports some of the connections between them. The encapsulation is molded around the assembled circuit.

There is shown in FIG. 1A an encapsulated electronic circuit assembly in accordance with one embodiment of the present invention, in which the encapsulation is dimensioned and configured for limited contact with a surrounding enclosure. Circuit assembly 10 (sometimes referred to herein as an "electronics module") comprises electronic circuit elements (not shown) mounted on a carrier 12 (e.g., a printed circuit board, lead frame, or the like), which is indicated in dotted outline. Circuit assembly 10 also comprises a generally rectangular encapsulation 14 within which the circuit elements and carrier are encased. Due to its polygonal, i.e., rectangular, configuration, encapsulation 14 defines a plurality of cylindrically protuberant longitudinally-extending edges 16 that can engage the cylindrical interior surface of a surrounding enclosure such as a closed-ended aluminum shell 18, shown in dotted outline. Shell 18 makes contact with edges 16 while the flat surfaces of the encapsulation principally remain distanced from the enclosure as if it were circumscribed about polygonal exterior of encapsulation 14. Due to the limited contact between encapsulation 14 and the interior surface 18a of the enclosure, a shock wave received by shell 18 can only impinge on the electronic circuit elements after being dissipated by the encapsulation from the point of contact, e.g., from edge 16, as suggested by dissipation wave lines 20. Preferably, encapsulation 14 is configured so that the points of contact through which shock waves may be received propagate the shock waves at an oblique angle relative to carrier 12.

In an alternative "limited contact" configuration shown in FIG. 1B, a circuit assembly 10a in accordance with the present invention is disposed within an enclosure comprising an open-ended sleeve 22 that is insertable within a shell. Sleeve 22 is preferably formed from stainless steel and serves to protect circuit assembly 10a against external compressive forces. FIG. 1B also illustrates an alternative configuration for the encapsulation 14' to provide further reduced contact between the encapsulation and the surrounding enclosure. Thus, carrier 12 is disposed in a generally rectangular encapsulation 14', but only the peripherally, cylindrically protruding portions 14a, 14b at the opposite ends of the enclosure are dimensioned and configured to engage the interior surface of sleeve 22. Thus, encapsulation 14' engages sleeve 22 only along foreshortened edges 16a and 16b of the protruding portions thereof.

Figure 2B:
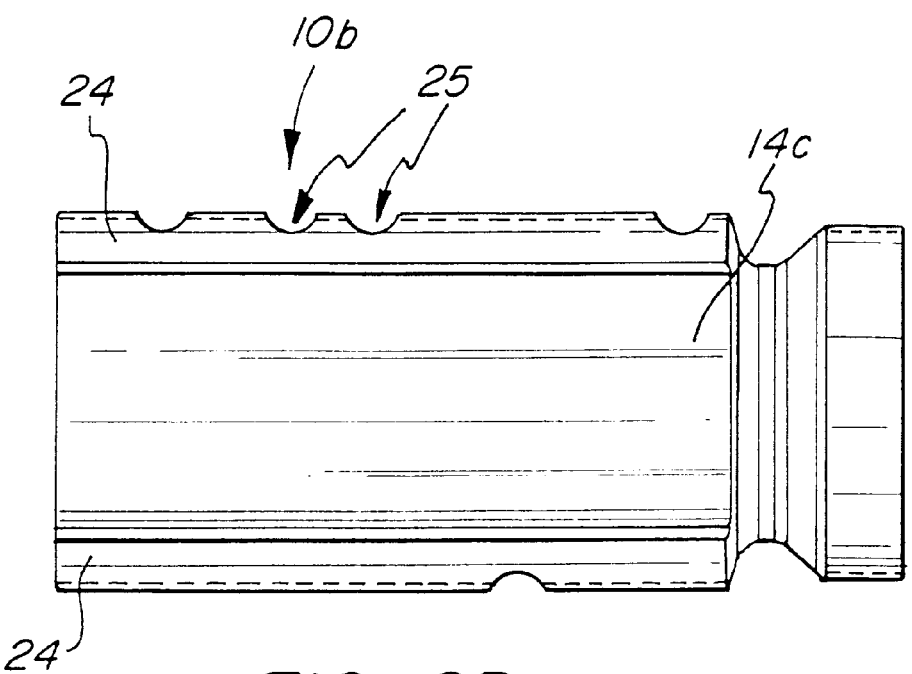
FIG. 2B is a view of the electronics module of FIG. 2A viewed along lines 2B—2B.

Another limited contact embodiment of the present invention is seen in FIGS. 2A and 2B, which show that circuit assembly 10b comprises an encapsulation 14c that is configured to have a plurality of longitudinally-extending, cylindrically protuberant contact pads or fins 24 that extend beyond the otherwise circular periphery of encapsulation 14c. As seen in FIG. 2B, encapsulation 14c is also configured to have scallops 25 formed therein. As will be explained further below, scallops 25 allow electrical test contacts or "leads" for the electronic circuits or chips within encapsulation 14c to be exposed while allowing the contacts to remain within the profile of the encapsulation. In this way, the electrical contacts are accessible but do not interfere with positioning or suspending the encapsulated circuitry within the surrounding structure. Circuit assembly 10b is designed so that output leads 57 and initiation input leads 56 protrude from respective opposite ends of encapsulation 14c for connection to other devices, as described below.

Figure 2C:
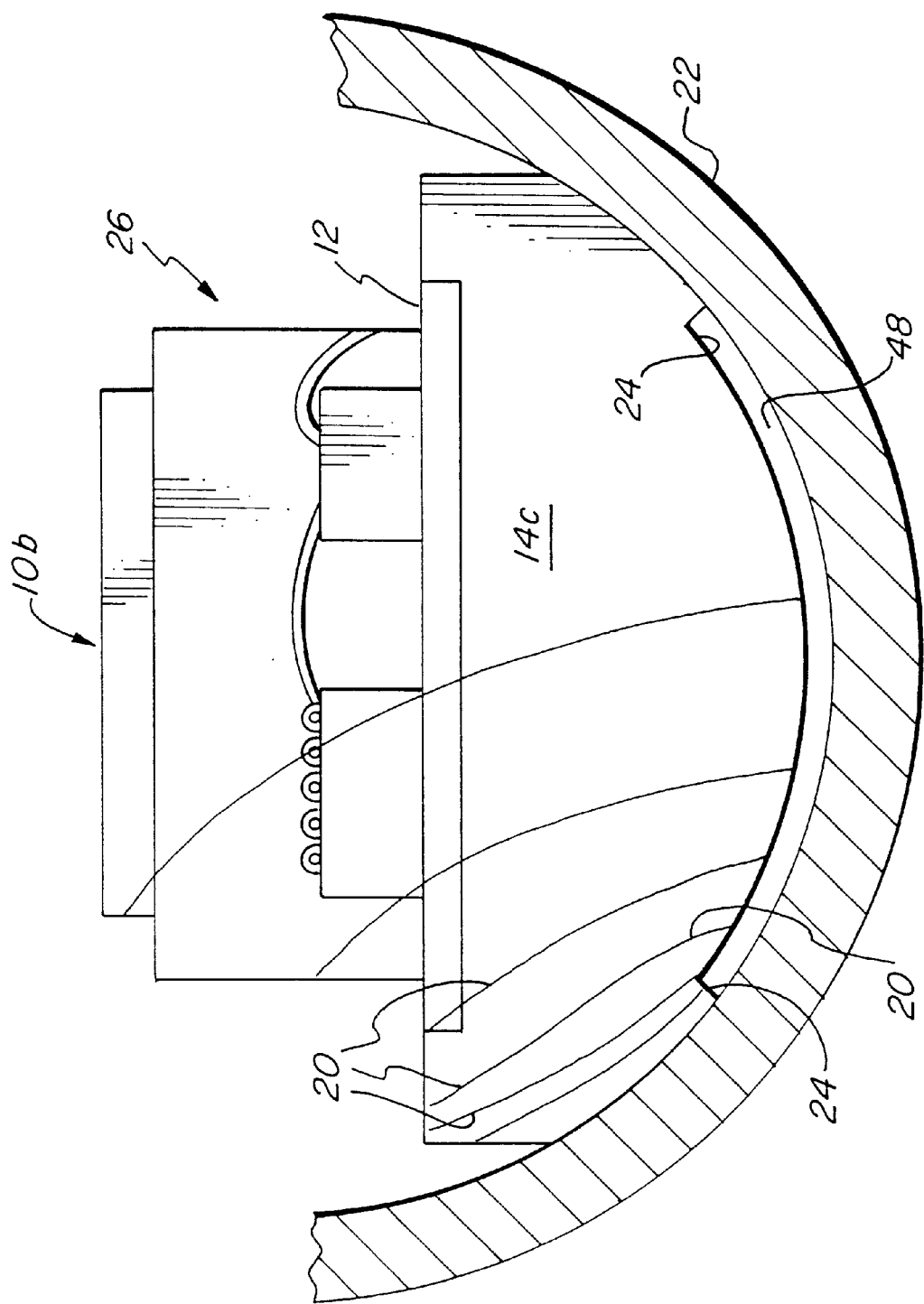
FIG. 2C is a partial, schematic, cross-sectional view of the electronics module of FIGS. 2A and 2B disposed within a sleeve.

FIG. 2C provides a view showing how fins 24 establish only limited contact between encapsulation 14c and a surrounding enclosure structure such as sleeve 22 by establishing a gap 48 between the remainder of the periphery of encapsulation 14c and sleeve 22. Dissipation waves 20 illustrate how fins 24 dissipate shock waves received from sleeve 22. A portion of encapsulation 14c is omitted from FIG. 2C so that miscellaneous electronic components 26 and carrier 12 can be seen.

Figure 3A:
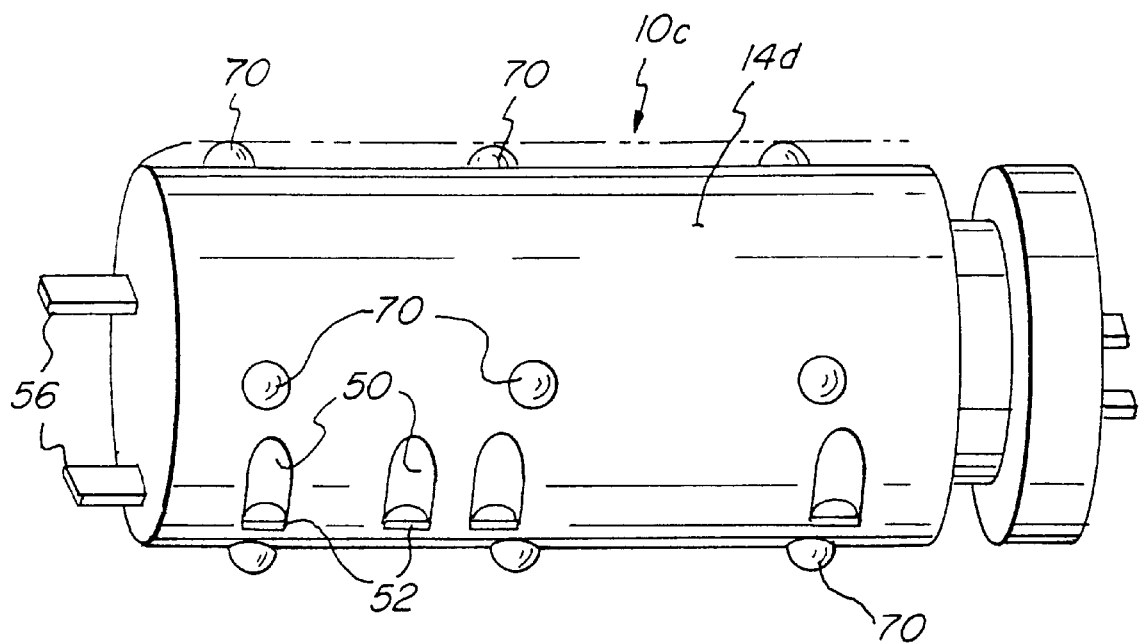
FIG. 3A is a perspective view of an electronics module in accordance with yet another embodiment of the present invention.
Figure 3B:
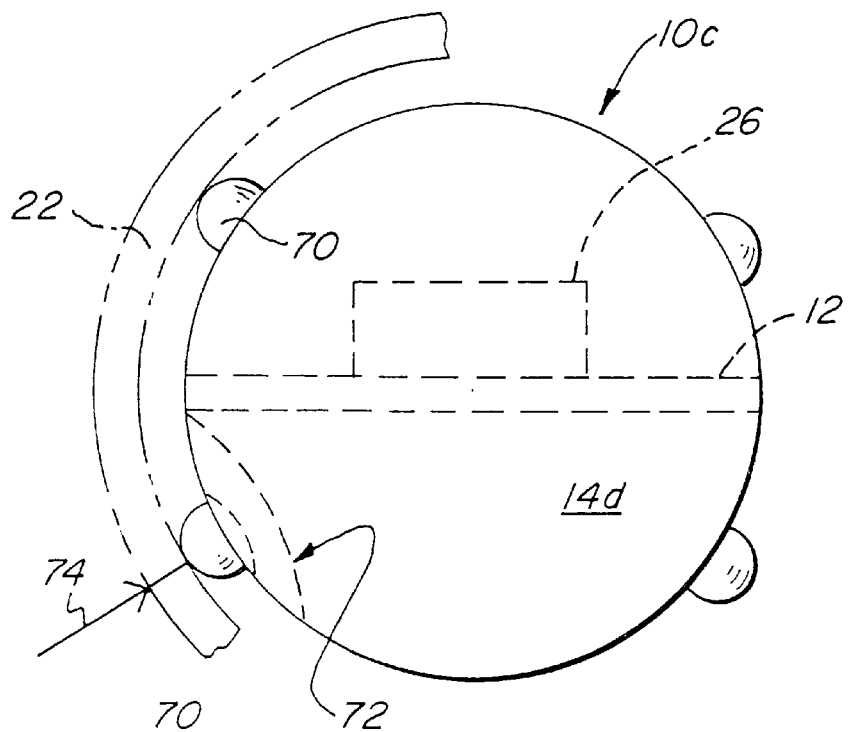
FIG. 3B is a schematic cross-sectional view of the electronics module of FIG. 3A, and an enclosure, illustrating protuberant bosses engaging the enclosure.

Yet another limited contact embodiment of an encapsulated electronic circuit according to the present invention is illustrated in FIGS. 3A and 3B, where it is seen that circuit assembly 10c comprises an encapsulation 14d that is dimensioned and configured to have a cylindrically protuberant configuration due to the presence of bosses 70 that protrude from the otherwise cylindrical exterior surface of encapsulation 14d. Encapsulation 14d, including bosses 70, is dimensioned and configured so that when inserted into an enclosure having a cylindrical interior surface, bosses 70 engage the interior surface of the enclosure and most, if not all, of the remainder of the exterior surface of encapsulation 14d is distanced from the interior surface of the enclosure. Circuit assembly 10b comprises input leads 56 (FIG. 3A) that protrude from encapsulation 14d to permit the electrical components therein to be operatively connected to external electrical components. As seen in FIG. 3A, encapsulation 14d defines scallops 50 to provide access to leads 52 without requiring that the leads protrude beyond the surface profile of encapsulation 14d, just as does the embodiment of FIGS. 2A, 2B and 2C. FIG. 3B illustrates that bosses 70 engage the interior surface of an enclosure such as sleeve 22 and, as indicated by shock wave dispersion lines 72, will disperse shock waves indicated at 74 that impinge on the enclosure, i.e., sleeve 22, and that are transferred to encapsulation 14d.

A circuit assembly with an encapsulation in accordance with the present invention can be used in a detonator to provide an electronically-controlled delay in the firing of the detonator, which can operate with either an electric or non-electric initiation signal means. For example, an electrical initiation signal line may be connected to input leads 56 (FIG. 3A) from a remote source controlled by a user to provide an initiation signal to a suitably configured circuit assembly. Alternatively, the circuit assembly may be used with a non-electric initiation signal means, e.g., for use with a detonating cord, shock tube, etc., provided that there is provided at least a transducer to convert the non-electric initiation signal to an electrical signal that can be used to initiate the circuit assembly. The term "initiation signal means", as used herein and in the claims, is meant to encompass electrical initiation signal transmission lines as well as non-electric initiation signal transmission lines and their associated transducers for delivering an electrical initiation signal to the input leads of the circuit assembly of this invention.

Figure 4:
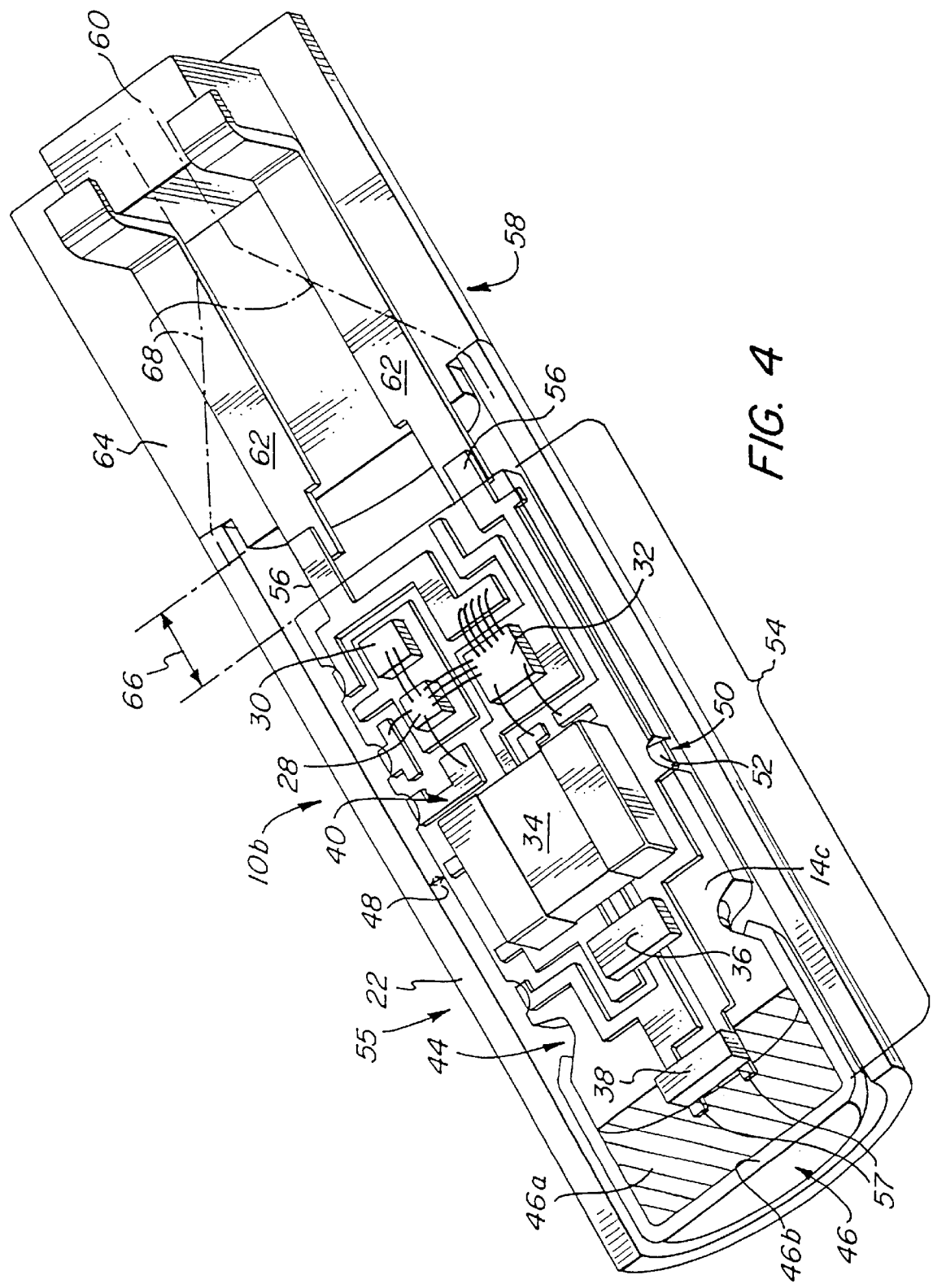
FIG. 4 is a partly cross-sectional perspective view of a transducer-delay initiation assembly comprising an electronics module and sleeve of FIG. 2C together with a transducer module.

FIG. 4 provides a perspective view of a transducer-circuit assembly (or "transducer-initiator") 55 comprising an electronics module 54 that comprises the circuit assembly 10b and sleeve 22 of FIGS. 2A, 2B and 2C and an output initiation means 46. Transducer-circuit assembly 55 also comprises a transducer module 58 that serves as part of an initiation signal transmission means to convert a non-electric initiation signal to a pulse of electrical energy to activate electronics module 54. Various circuit components of circuit assembly 10b such as an integrated timer circuit 28, a timer resistor 30, an integrated switching circuit 32, a storage capacitor 34, and a bleeder resistor 36 are mounted on lattice-like portions of a carrier comprising lead frame 40 and are disposed within encapsulation 14c. The output initiation means 46 comprises a bridge element such as semiconductor bridge 38 connected to output leads 57, an initiation charge 46a which preferably comprises a secondary explosive material or a suitable substitute therefor such as tetraammine-cis-bis (5-nitro-2Htetrazolato-$N^2$) cobalt (III) perchlorate ("BNCP"), certain primary explosives and energetic mixes such as zirconium potassium perchlorate, and an initiation shell 46b that is crimped onto neck region 44 and which holds initiation charge 46a in energy transfer relation to semiconductor bridge 38. The explosive output initiation signal provided by the output initiation means 46 may be used, e.g., to initiate the base charge or "output" charge of a detonator within which assembly 55 is disposed, and may thus comprise part of the output means for the detonator, as described below with reference to FIG. 6A.

Encapsulation 14c engages sleeve 22 (see FIG. 2C) only at the fins (which are not visible in FIG. 4) and thus establishes a gap 48 between encapsulation 14c and sleeve 22. As indicated above, encapsulation 14c defines scallops 50 where test or program leads 52 can be accessed through encapsulation 14c so that the circuit therein can be programmed and/or tested prior to assembly of the detonator. Scallops 50 preferably allow the lead to remain within the surface profile of encapsulation 14c, i.e., the leads preferably do not extend into gap 48. Scallops 50 may be omitted provided the test leads do not protrude from encapsulation 14c farther than the fins so that they do not extend across gap 48 to contact the surrounding enclosure. Thus, electronics module 54 can be inserted into sleeve 22 and leads 52 will not contact sleeve 22.

Transducer module 58 (FIG. 4) comprises a piezoelectric transducer 60 and two transfer leads 62 disposed in a transducer bushing 64. Upon receipt of a shock wave, transducer 60 produces an electrical pulse that is delivered to circuit assembly 10b via transfer leads 62 and input leads 56. Transducer bushing 64 is dimensioned and configured to engage sleeve 22 so that transducer module 58 can be secured onto the end of sleeve 22 with leads 62 in contact with input leads 56. Electronics module 54, sleeve 22 and transducer module 58 are dimensioned and configured so that, when assembled as shown in FIG. 4, an air gap indicated at 66 is established between electronics module 54 and transducer module 58. In this way, electronics module 54 is at least partially shielded from the shock wave that causes piezoelectric transducer 60 to create the electrical pulse for the circuit assembly. The pressure imposed by such shock wave is transferred through transducer module 58 onto sleeve 22, as indicated by force arrows 68, rather than onto electronics module 54.

Figure 5A:
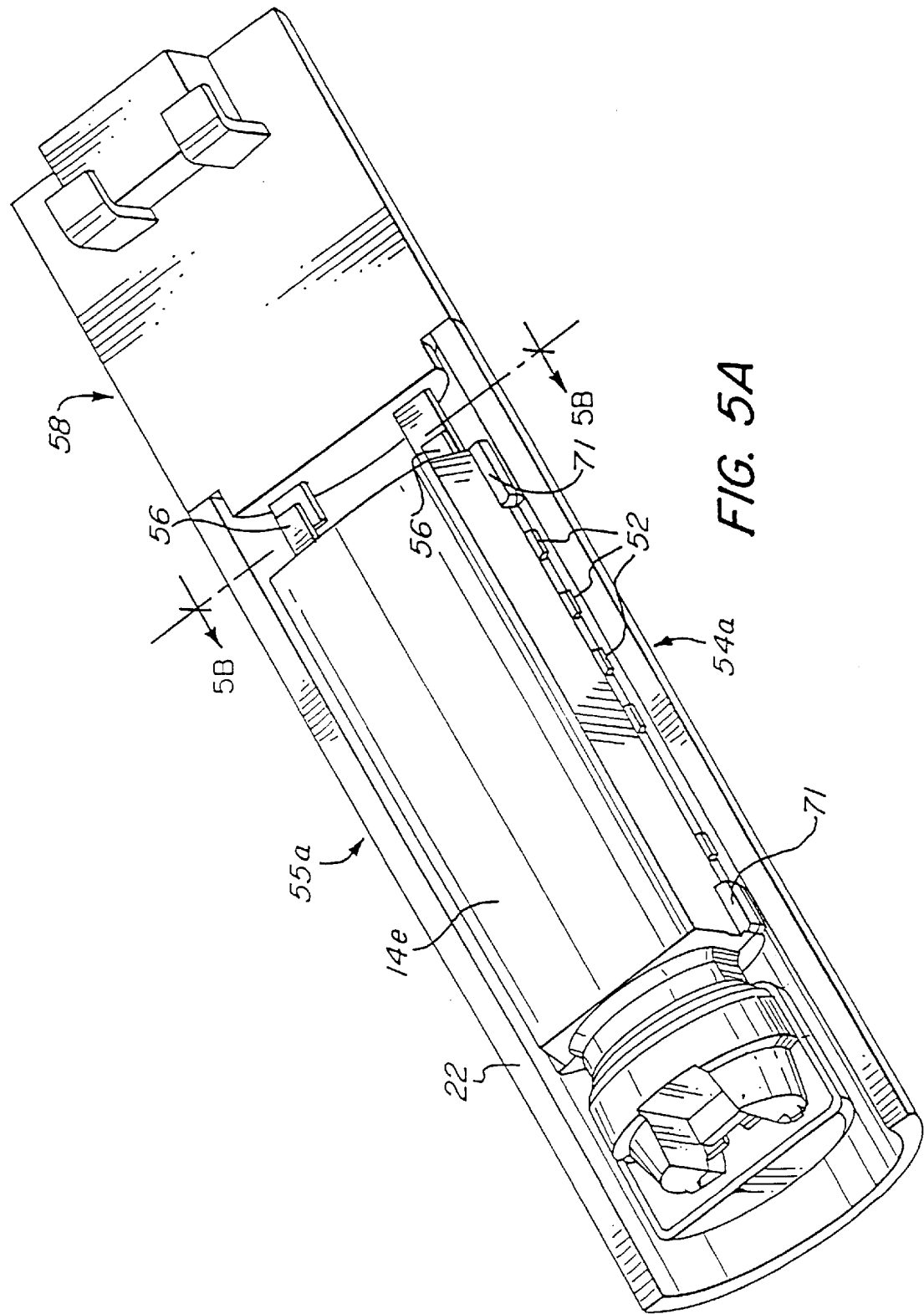
FIG. 5A is a view similar to FIG. 4 of an alternative embodiment of the invention.
Figure 5B:
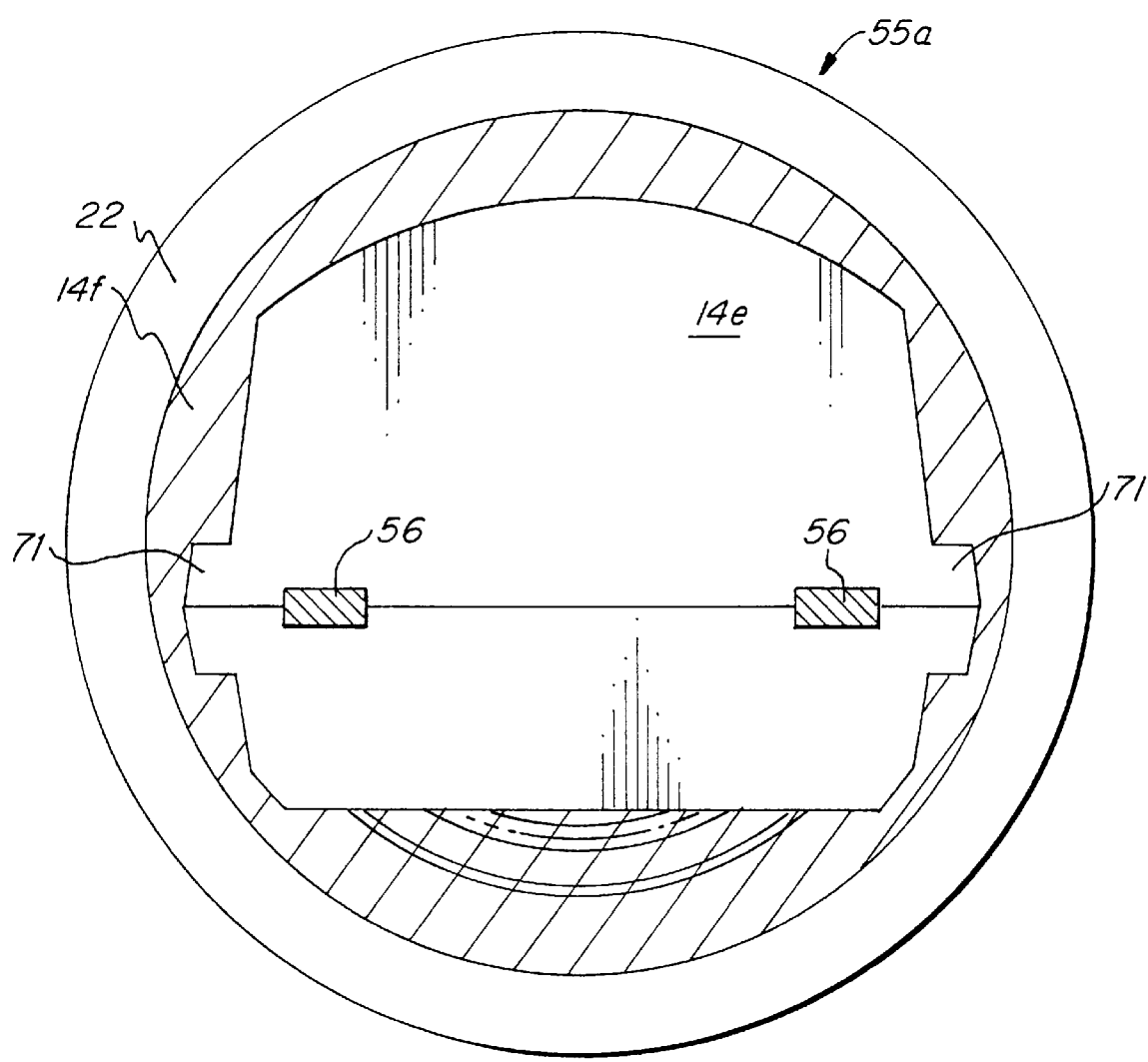
FIG. 5B is a partly cross-sectional view of the transducer-delay initiation assembly of FIG. 5A taken along line 5B—5B.

FIGS. 5A and 5B illustrate a transducer-delay initiation assembly 55a according to an alternative embodiment of the invention in which the encapsulation for the electronic circuit is not configured for limited contact with the enclosure. In this embodiment, the encapsulation comprises a casing for the electronic components and the carrier. The casing 14e comprises a structural support material and a decoupling material 14f. Generally, the structural support material of casing 14e should have a Young's Modulus of at least $5\times10^5$ psi and preferably has a Young's Modulus in the range of about $1\times10^6$ psi to $40\times10^6$ psi. Preferably, the structural support material has a strength of at least about 5000 psi and a coefficient of thermal expansion that matches that of the integrated circuit components therein. Casing 14e may comprise, e.g., a glass-filled epoxy casing 14e that has, when cured, a density of at least about 1 gram per cubic centimeter (g/cc) and a Young's Modulus of $1\times10^6$ psi. Such an epoxy material is available from Sumitomo Corporation under the designation Resin No. 6300 and is stated to be 60 percent glass-filled. Casing 14e is sufficiently rigid when cured to provide structural support to the circuit and help prevent damage to the circuit from inadvertent bending. As seen in FIG. 5A, casing 14e is generally rectangular in configuration and is configured to have substantially smooth sides 27 from which the leads 52 protrude. To prevent leads 52 from bearing against the electrically conductive sleeve 22 and thus possibly short-circuiting the electronic circuit therein, casing 14e is configured to define stand-offs 71 which protrude from sides 27 of casing 14e further than leads 52. Thus, should casing 14e come into contact with sleeve 22 during assembly, stand-offs 71 will prevent the leads 52 from engaging the interior surface of the sleeve 22.

Casing 14e may be dimensioned and configured for limited longitudinal contact with the interior surface of sleeve 22 as described above, e.g., in relation to FIGS. 1A and 1B, but casing 14e is preferably dimensioned and configured as suggested in FIG. 5B so that when centered within sleeve 22 it does not make direct contact with the interior surface thereof. In the illustrated embodiment, the space between the casing 14e and sleeve 22 is substantially wholly filled by a shock-absorbing, decoupling material 14f of the encapsulation. In a particular embodiment of the invention, decoupling material 14f has a density of only 0.8 g/cc and a Young's Modulus of 5000 psi and thus differs significantly from the glass-filled epoxy of casing 14e. The decoupling material may comprise an elastic polymeric material, e.g., a silicone, and may optionally be formed as a foam. A decoupling material comprising a swatch of foam padding may be adhered to casing 14e to engage the interior surface of the sleeve. However, it is expected that a more suitable method for disposing a decoupling material of the encapsulation between a structural support material and the enclosure will comprise injecting foamed polymeric decoupling material into the space between them, e.g., in the space between the epoxy casing 14e and sleeve 22. The decoupling material between the sleeve and the circuit within the encapsulation serves to attenuate the force of shock waves that may be transmitted from the surroundings of the circuit, and thus protects the circuit. This protective effect is attained without the need to limit contact between the decoupling material 14f and the interior of the enclosure, but the protective effect is enhanced when the decoupling material is physically configured for limited contact with the enclosure as described above with reference to FIGS. 1A through 3B. The protective function of the encapsulation is further enhanced because, as suggested above, casing 14e is dimensioned and configured so that it defines a non-uniform offset from the cylindrical interior surface of sleeve 22. Specifically, casing 14e is substantially rectangular, and is therefore cylindrically protuberant even though it does not directly engage the interior surface of sleeve 22. Accordingly, for example, the distance between one edge of casing 14e and the interior surface of sleeve 22, represented as offset $S_1$, is significantly shorter than the distance between a point on the side of casing 14e and the interior surface of sleeve 14e, represented as S2. Any remnants of a shock wave received by casing 14e will be dissipated by its irregular configuration relative to sleeve 22 before it encounters the circuit within. Other cylindrically protuberant configurations for casing 14e will, likewise, enhance the protective function of the encapsulation.

Referring now to FIG. 6A there is shown a digital delay detonator comprising a circuit assembly in accordance with one embodiment of the present invention. Delay detonator 100 comprises an initiation signal means comprising a non-electric input transmission line which comprises, in the illustrated case, a shock tube 110, adapter bushing 114, isolation cup 118, booster charge 120 and transducer module 58. As is well-known to those skilled in the art, shock tube comprises hollow plastic tubing, the inside wall of which is coated with an explosive material so that, upon ignition, a low energy shock wave is propagated through the tube. See, for example, Thureson et al, U.S. Pat. No. 4,607,573. (It will be understood that other non-electric signal transmission lines such as detonating cord, low energy detonating cord, low velocity shock tube and the like may be used in place of shock tube.) Shock tube 110 is secured in the open end 112a of an enclosure comprising a housing 112 by an adapter bushing 114 about which housing 112 is crimped at crimps 116, 116a. Bushing 114 also helps to form an environmentally protective seal between housing 112 and the outer surface of shock tube 110. Housing 112 is made of an electrically conductive material, usually aluminum, and is preferably the size and shape of conventional blasting caps, i.e., detonators. A segment 110a of shock tube 110 within housing 112 terminates at end 110b in close proximity to, or in abutting contact with, an anti-static isolation cup 118.

Isolation cup 118, as best seen in FIG. 6B, is of a type well-known in the art and is made of a semiconductive material, e.g., a carbon-filled polymeric material, so that it forms a path to housing 112 to dissipate any static electricity which may travel along shock tube 110. For example, see Gladden U.S. Pat. No. 3,981,240. A low energy booster charge 120 is positioned adjacent to isolation cup 118 and in signal communicating relationship with end 110b of shock tube 110. As best seen in FIG. 6B and as is well-known in the art, isolation cup 118 comprises a generally cylindrical body (usually in the form of a truncated cone disposed with the larger diameter positioned towards the open end 112a of housing 112), the interior of which is divided by a thin, rupturable membrane 118b into an entry chamber 118a and an exit chamber 118c. The end 110b of shock tube 110 (FIG. 6A) may be received within entry chamber 118a (shock tube 110 is not shown in FIG. 6B for clarity of illustration). Exit chamber 118c provides an air space or stand-off between the end 110b of shock tube 110 and booster charge 120. In operation, the shock wave signal traveling through shock tube 110 will rupture membrane 118b and traverse the stand-off provided by exit chamber 118c and impinge upon and detonate booster charge 120.

Booster charge 120 comprises a small quantity of explosive 124, upon which is disposed a first cushion element 126. Explosive 124 typically comprises a primary explosive such as lead azide, but may comprise a suitable secondary explosive, e.g., BNCP. A first cushion element 126, which is annular in shape save for a thin central membrane, is disposed between isolation cup 118 and explosive 124 to bear the tamping pressure with which explosive 124 is pressed during manufacture of detonator 100, to protect explosive 124 from the direct application of pressure.

Isolation cup 118, first cushion element 126, and booster charge 120 may conveniently be fitted into a booster shell 132 as shown in FIG. 5B. The outer surface of isolation cup 118 is in conductive contact with the inner surface of booster shell 132, which in turn is dimensioned and configured to have a friction fit with the interior of housing 112, and thus provides a path of electrical conductivity from shock tube 110 to housing 112. Generally, booster shell 132 is inserted into housing 112 and housing 112 is crimped to retain booster shell 132 therein as well as to protect the contents of housing 112 from the environment.

A non-conductive buffer 128, which is typically 0.015 inch thick, is located between booster charge 120 and a transducer module 58 to electrically isolate transducer module 58 from booster charge 120. Transducer module 58 comprises a piezoelectric transducer that is disposed in force-communicating relationship with booster charge 120 and so can convert the output force of booster charge 120 to a pulse of electrical energy. The output leads of transducer module 58 are connected to electronics module 54 as shown in FIG. 4. As illustrated in FIG. 5, the enclosure provided by detonator 100 comprises housing 112 and an optional open-ended steel sleeve 22 therein that encloses electronics module 54 and that is configured to have a friction fit with the interior of housing 112.

Detonator 100 comprises an output means to produce a detonation output signal at the end of the delay interval. As indicated above, part of the detonator output means comprises the output initiation means 46 of electronics module 54 (shown in FIG. 4), adjacent to which in detonator 100 is a second cushion element 142, which is similar to first cushion element 126. Second cushion element 142 separates the output initiation means of electronics module 54 from the remainder of the detonator output means comprising output charge 144 disposed at the closed end 112b of housing 112. Output charge 144 comprises an optional primary explosive 144a (for which a suitable secondary explosive material, e.g., BNCP, may be substituted) and a secondary explosive 144b. The secondary explosive 144b has sufficient shock power to rupture housing 112 and detonate cast booster explosives, dynamite, etc., disposed in signal transfer proximity to detonator 100.

In use, a non-electric initiation signal in the initiation signal means travels through shock tube 110 and is emitted at end 110b. The signal ruptures membrane 118b of isolation cup 118 and first cushion element 126 to initiate explosive 124 of booster charge 120. Explosive 124 generates a detonation shock wave that bears on the piezoelectric transducer in transducer module 58. Transducer module 58 then produces a pulse of electrical energy that is received by electronics module 54. Thus, the non-electric initiation signal means delivers an initiation signal to the circuit assembly of electronics module 54. The circuit assembly stores the pulse of electric energy and, after a predetermined delay, releases or conveys the energy to the output initiation means which initiates output charge 144.

As indicated above, in alternative embodiments, the encapsulated circuit assembly of the present invention may be used with an electric detonator delay circuit designed for use with an electric signal transmission wire instead of a shock tube or other non-electric signal transmission line. In such a circuit, of course, there would be no need for a booster charge 120 or a transducer module 58.

While the invention has been described in detail with reference to particular embodiments thereof, it will be apparent that upon a reading and understanding of the foregoing, numerous alterations to the described embodiments will occur to those skilled in the art. For example, it will be understood that even if the enclosure does not have a cylindrical interior surface, the configuration of the circuit encapsulation can be adapted for limited contact therewith. It is intended to include such alterations within the scope of the appended claims.

What is claimed is:

1. A shock-resistant electronic circuit assembly comprising a rigid enclosure and an electronic circuit encased in an encapsulation within the enclosure, the encapsulation comprising longitudinally-extending contact pads that engage the interior surface of the enclosure;

wherein the electronic circuit comprises a delay circuit comprising (i) storage means connected to an input terminal for receiving and storing electrical energy;

(ii) a switching circuit connecting the storage means to an output terminal for receiving and storing electrical energy;

(iii) an initiation element connected to the output terminal;

(iv) the timer circuit being operatively connected to the switching circuit for controlling the release by the switching circuit of energy stored by the storage means to the initiation element;

wherein the input terminal extends through the encapsulation to permit delivery of electrical energy to the storage means from outside the encapsulation; and wherein the output terminal extends through the encapsulation for delivering electrical energy from the storage means via the switching circuit to outside the encapsulation.

2. The circuit assembly of claim 1 wherein the enclosure comprises a cylindrical interior surface and wherein the pads leave a portion of the encapsulation distanced from the cylindrical interior surface of the enclosure.

3. A shock-resistant electronic circuit assembly comprising an electronic circuit encased in an encapsulation that is dimensioned and configured to define a plurality of bosses that protrude from an otherwise cylindrical exterior surface;

wherein the electronic circuit comprises a delay circuit comprising (i) storage means connected to an input terminal for receiving and storing electrical energy;

(ii) a switching circuit connecting the storage means to an output terminal for receiving and storing electrical energy;

(iii) an initiation element connected to the output terminal;

(iv) the timer circuit being operatively connected to the switching circuit for controlling the release by the switching circuit of energy stored by the storage means to the initiation element, wherein the input terminal extends through the encapsulation to permit delivery of electrical energy to the storage means from outside the encapsulation, and wherein the output terminal extends through the encapsulation for delivering electrical energy from the storage means via the switching circuit to outside the encapsulation; and an output initiation means operatively connected to the storage means for receiving via the switching circuit energy stored by the storage means and for generating an explosive output initiation signal in response thereto, and a sleeve having an interior enclosure surface dimensioned and configured to receive the delay circuit assembly therein, wherein the encapsulation engages the interior surface of the sleeve in shock-dispersing contact therewith.

4. A transducer assembly unit comprising the circuit assembly of claim 3 and a transducer module comprising a bushing that is dimensioned and configured to engage the sleeve, a piezoelectric transducer in the bushing and a pair of transducer leads connected to the input terminal of the circuit.

5. A shock-resistant electronic circuit assembly comprising an electronic circuit encased in an encapsulation that is dimensioned and configured to define a plurality of bosses that protrude from an otherwise cylindrical exterior surface;

wherein the electronic circuit comprises a delay circuit comprising (i) storage means connected to an input terminal for receiving and storing electrical energy;

(ii) a switching circuit connecting the storage means to an output terminal for receiving and storing electrical energy;

(iii) an initiation element connected to the output terminal;

(iv) a timer circuit operatively connected to the switching circuit for controlling the release by the switching circuit of energy stored by the storage means to the initiation element, wherein the input terminal extends through the encapsulation to permit delivery of electrical energy to the storage means from outside the encapsulation, and wherein the output terminal extends through the encapsulation for delivering electrical energy from the storage means via the switching circuit to outside the encapsulation; and wherein the encapsulation comprises a decoupling material and a structural support material, each of which has a density and wherein the density of the decoupling material is at least about 20 percent less than the density of the structural support material.

6. A delay detonator comprising:

an enclosure comprising at least a housing closed at one end and open at the other end for connection to an initiation signal means, the enclosure having an interior surface;

the initiation signal means secured in the open end of the housing for providing an electric initiation signal to a circuit assembly disposed in the enclosure for receipt of a signal from the initiation signal means, the circuit assembly comprising a delay circuit comprising (i) storage means connected to the initiation signal means for receiving and storing electrical energy from the initiation signal means;

(ii) a switching circuit connecting the storage means to an output means, for releasing energy stored by the storage means to the output means in response to a signal from a timer circuit;

(iii) a timer circuit operatively connected to the switching circuit for controlling the release by the switching circuit of energy stored by the storage means to the output means; and (iv) an encapsulation encasing the delay circuit and engaging the interior surface of the enclosure in limited contact therewith; and output means disposed in the housing in operative relation to the storage means through the switching circuit for receiving energy stored by the storage means and generating an explosive output in response thereto;

wherein the encapsulation is dimensioned and configured to define a plurality of protuberant bosses for limited contact with an interior surface of the enclosure.

7. A delay detonator comprising:

an enclosure comprising at least a housing closed at one end and open at the other end for connection to an initiation signal means, the housing having an interior surface;

the initiation signal means secured in the open end of the housing for providing an electric initiation signal to a circuit assembly disposed in the housing for receipt of a signal from the initiation signal means, the circuit assembly comprising a delay circuit comprising (i) storage means connected to the initiation signal means for receiving and storing electrical energy from the initiation signal means;

(ii) a switching circuit connecting the storage means to an output means, for releasing energy stored by the storage means to the output means in response to a signal from a timer circuit;

(iii) a timer circuit operatively connected to the switching circuit for controlling the release by the switching circuit of energy stored by the storage means to the output means; and (iv) an encapsulation encasing the delay circuit and being dimensioned and configured for shock-dispersing contact with the interior surface of the housing; and output means disposed in the housing in operative relation to the storage means through the switching circuit for receiving energy stored by the storage means and generating an explosive output in response thereto;

wherein the interior surface of the housing comprises a cylindrical interior surface and wherein the encapsulation has a non-cylindrical configuration.

8. A delay detonator comprising:

an enclosure comprising at least a housing closed at one end and open at the other end for connection to an initiation signal means, the housing having an interior surface;

the initiation signal means being secured in the open end of the housing for providing an electric initiation signal to a circuit assembly disposed in the housing for receipt of a signal from the initiation signal means, the circuit assembly comprising (i) storage means for receiving and storing electrical energy from the initiation signal means;

(ii) a switching circuit connecting the storage means to an output means, for releasing energy stored by the storage means to the output means in response to a signal from a timer circuit;

(iii) the timer circuit being operatively connected to the switching circuit for controlling the release by the switching circuit of energy stored by the storage means to the output means; and (iv) an encapsulation that encases elements (i), (ii) and (iii) and that engages an interior surface of the housing; and output means disposed in the housing in operative relation to the storage means through the switching circuit for receiving energy stored by the storage means and generating an explosive output in response thereto;

wherein the encapsulation comprises a structural support material that encases the circuit and a decoupling material that engages the interior surface of the housing; and wherein the decoupling material and the structural support material each has a density and wherein the density of the decoupling material is at least 20 percent less than the density of the structural support material.

9. The detonator of claim 8 wherein the encapsulation is dimensioned and configured for limited contact with an interior surface of the housing.

10. A delay detonator comprising:

an enclosure comprising at least a housing closed at one end and open at the other end for connection to an initiation signal means, the enclosure having an interior surface;

the initiation signal means being secured in the open end of the housing for providing an electric initiation signal to a circuit assembly disposed in the enclosure for receipt of a signal from the initiation signal means, the circuit assembly comprising (i) storage means for receiving and storing electrical energy from the initiation signal means;

(ii) a switching circuit connecting the storage means to an output means, for releasing energy stored by the storage means to the output means in response to a signal from a timer circuit;

(iii) the timer circuit being operatively connected to the switching circuit for controlling the release by the switching circuit of energy stored by the storage means to the output means; and (iv) an encapsulation that encases elements (i), (ii) and (iii) and that engages an interior surface of the enclosure; and output means disposed in the housing in operative relation to the storage means through the switching circuit for receiving energy stored by the storage means and generating an explosive output in response thereto, wherein the encapsulation comprises a structural support material and a decoupling material that engages the interior surface of the enclosure;

wherein the structural support material is dimensioned and configured to comprise cylindrically protuberant portions for a non-uniform offset from the interior surface of the enclosure.

11. A delay detonator comprising:

an enclosure comprising at least a housing closed at one end and open at the other end for connection to an initiation signal means, the housing having an interior surface;

the initiation signal means being secured in the open end of the housing for providing an electric initiation signal to a circuit assembly disposed in the enclosure for receipt of a signal from the initiation signal means, the circuit assembly comprising (i) storage means for receiving and storing electrical energy from the initiation signal means;

(ii) a switching circuit connecting the storage means to an output means, for releasing energy stored by the storage means to the output means in response to a signal from a timer circuit;

(iii) the timer circuit being operatively connected to the switching circuit for controlling the release by the switching circuit of energy stored by the storage means to the output means; and (iv) an encapsulation that encases elements (i), (ii) and (iii) and that engages an interior surface of the housing; and output means disposed in the housing in operative relation to the storage means through the switching circuit for receiving energy stored by the storage means and generating an explosive output in response thereto;

wherein the encapsulation comprises a structural support material that encases the circuit and a decoupling material that engages the interior surface of the housing;

wherein the housing comprises a cylindrical interior surface and the structural support material has a generally rectangular configuration; and wherein the structural support material is spaced from the interior surface of the enclosure, and the decoupling material substantially wholly fills said space.

* * * * *